United States Patent
Li et al.

(10) Patent No.: US 10,284,246 B2
(45) Date of Patent: May 7, 2019

(54) CARD HOLDER AND ELECTRONIC DEVICE (71) Applicant: ZTE CORPORATION, Shenzhen, Guangdong (CN)

(72) Inventors: Daode Li, Guangdong (CN); Fanhu Meng, Guangdong (CN)

(73) Assignee: ZTE Corporation, Guangdong (CN)

( * ) Notice: Subject to any disclaimer, the term of this patent is extended or adjusted under 35 U.S.C. 154(b) by 0 days.

(21) Appl. No.: 15/572,144

(22) PCT Filed: Aug. 6, 2015

(86) PCT No.: PCT/CN2015/086236
§ 371 (c)(1),
(2) Date: Nov. 6, 2017

(87) PCT Pub. No.: WO2016/176920
PCT Pub. Date: Nov. 10, 2016

(65) Prior Publication Data
US 2018/0123630 A1    May 3, 2018

(30) Foreign Application Priority Data

May 7, 2015 (CN) .......................... 2015 1 0229667

(51) Int. Cl.
*H04B 1/3818* (2015.01)
*H05K 7/12* (2006.01)
(Continued)

(52) U.S. Cl.
CPC ......... *H04B 1/3818* (2015.01); *G06K 13/085* (2013.01); *G06K 13/0831* (2013.01);
(Continued)

(58) Field of Classification Search
CPC ...... H04B 1/3818; G06K 13/082; H05K 7/12; H04M 2250/14
(Continued)

(56) References Cited

U.S. PATENT DOCUMENTS 5,655,917 A * 8/1997 Kaneshige ............. G06K 13/08
439/155
5,895,903 A * 4/1999 Abe ..................... G06K 7/0021
235/375

(Continued)

FOREIGN PATENT DOCUMENTS

| CN | 203166221 U | 8/2013 |
| CN | 103579844 A | 2/2014 |

(Continued)

OTHER PUBLICATIONS

International Search Report dated Jan. 26, 2016 for International Application No. PCT/CN2015/086236, 4 pages.

*Primary Examiner* — Hai V Nguyen
(74) *Attorney, Agent, or Firm* — Knobbe, Martens, Olson & Bear, LLP (57) ABSTRACT

Disclosed are a card holder and an electronic device. The electronic device includes: a device body provided with a card holder slot and a card holder installed in the card holder slot, where a limiting rib is arranged in the card holder slot. The card holder includes: a card holder body, a card holder cap arranged on the card holder body and force application pieces for applying a force to the card holder cap towards the card holder body. The card holder cap is movably connected with the card holder body. The force application pieces enable the card holder cap to keep close to the card holder body. A limiting surface is arranged on the card holder cap and is abutted against the limiting rib so that an outer wall surface of a side wall of the card holder cap is flush with a surface of the device body.

17 Claims, 11 Drawing Sheets

(51) Int. Cl.
*G06K 13/08* (2006.01)
*H01R 13/635* (2006.01)
*H01R 13/52* (2006.01)
*H01R 12/71* (2011.01)
*H01R 13/22* (2006.01)

(52) U.S. Cl.
CPC .............. *H05K 7/12* (2013.01); *H01R 12/714* (2013.01); *H01R 13/22* (2013.01); *H01R 13/5213* (2013.01); *H01R 13/635* (2013.01); *H04M 2250/14* (2013.01)

(58) Field of Classification Search
USPC .......................... 455/558; 439/160, 527, 630
See application file for complete search history.

(56) References Cited

U.S. PATENT DOCUMENTS

| | | | | |
|---|---|---|---|---|
| 6,174,205 | B1 * | 1/2001 | Madsen | H01R 27/02 439/638 |
| 6,217,351 | B1 * | 4/2001 | Fung | H01R 31/065 439/131 |
| 6,343,945 | B1 * | 2/2002 | Liikanen | G06K 7/0021 235/475 |
| 6,394,850 | B1 * | 5/2002 | Oliphant | H01R 12/721 439/354 |
| 6,561,824 | B1 * | 5/2003 | Beckham | G06F 1/1613 439/131 |
| 6,650,546 | B2 * | 11/2003 | Nelson | H05K 1/0231 174/363 |
| 6,667,942 | B2 * | 12/2003 | Maeda | G11B 17/043 720/642 |
| 6,824,063 | B1 * | 11/2004 | Wallace | G06K 7/0008 235/380 |
| 6,863,554 | B1 * | 3/2005 | Glad | H01R 13/44 439/344 |
| 6,888,724 | B2 * | 5/2005 | Shaie | H04B 1/3816 235/382 |
| 6,923,373 | B2 * | 8/2005 | Kanagawa | G06K 13/08 235/441 |
| 6,969,006 | B1 * | 11/2005 | Smith, Sr. | G06K 19/06196 235/487 |
| 7,012,813 | B2 * | 3/2006 | Wang | G06F 1/184 361/753 |
| 7,063,325 | B1 * | 6/2006 | Smith | A63B 69/0053 273/445 |
| 7,066,748 | B2 * | 6/2006 | Bricaud | G06K 13/08 439/159 |
| 7,075,319 | B2 * | 7/2006 | Mori | G01R 31/2886 324/750.25 |
| 7,309,016 | B2 * | 12/2007 | Lev | G06F 1/183 235/380 |
| 7,363,634 | B2 * | 4/2008 | Lin | G11B 17/056 720/609 |
| 7,374,441 | B2 * | 5/2008 | Rubenstein | H01R 12/7023 439/153 |
| 7,420,816 | B2 * | 9/2008 | Rubenstein | H05K 7/1461 361/727 |
| 7,458,857 | B2 * | 12/2008 | Lin | H04B 1/3816 439/630 |
| 7,518,858 | B2 * | 4/2009 | Takahashi | G06F 1/184 361/679.37 |
| 7,522,358 | B2 * | 4/2009 | Harada | G11B 7/0932 359/813 |
| 7,658,649 | B2 * | 2/2010 | Satoh | H01R 31/06 439/630 |
| 7,744,387 | B2 * | 6/2010 | Yu | G06K 19/07732 439/136 |
| 7,770,862 | B2 * | 8/2010 | Chen | F16M 11/10 248/188.91 |
| 7,828,203 | B2 * | 11/2010 | Sonetaka | H04M 1/72525 235/380 |
| 7,837,486 | B2 * | 11/2010 | Li | H01R 13/635 439/159 |
| 7,865,210 | B2 * | 1/2011 | Wang | H04M 1/026 455/550.1 |
| 8,004,491 | B2 * | 8/2011 | Maynard | G06F 17/2211 345/156 |
| 8,100,722 | B2 * | 1/2012 | Hu | H01R 13/2442 439/352 |
| 8,147,262 | B1 * | 4/2012 | Su | G06K 13/0831 439/159 |
| 8,150,466 | B2 * | 4/2012 | Park | G06K 7/0021 361/600 |
| 8,292,642 | B1 * | 10/2012 | Lee | G06K 7/0026 439/159 |
| 8,371,865 | B1 * | 2/2013 | Su | G06K 13/0862 439/155 |
| 8,371,866 | B1 * | 2/2013 | Su | G06K 13/0862 439/159 |
| 8,376,764 | B1 * | 2/2013 | Su | G06K 13/0831 439/157 |
| 8,393,909 | B1 * | 3/2013 | Lai | G06K 13/0831 439/159 |
| 8,432,682 | B2 * | 4/2013 | Quan | G06K 13/0825 361/679.38 |
| 8,460,019 | B2 * | 6/2013 | Lai | G06K 13/08 439/159 |
| 8,608,497 | B2 * | 12/2013 | Bychkov | G06K 13/0806 439/218 |
| 8,672,229 | B2 * | 3/2014 | Pesonen | H04B 1/3816 235/486 |
| 8,730,680 | B2 * | 5/2014 | Tang | G06K 13/0825 361/737 |
| 8,734,172 | B2 * | 5/2014 | Takei | H01R 12/7005 439/248 |
| 8,734,188 | B2 * | 5/2014 | Nakase | G06K 13/0831 439/159 |
| 8,740,635 | B2 * | 6/2014 | Lim | G06K 13/08 439/159 |
| 8,747,131 | B2 * | 6/2014 | Nakase | G06K 13/0831 439/159 |
| 8,801,468 | B2 * | 8/2014 | Gao | G06K 13/0831 439/630 |
| 8,902,609 | B2 * | 12/2014 | Duan | G06K 13/0831 361/727 |
| 8,976,521 | B2 * | 3/2015 | Liu | G06K 7/0021 361/679.38 |
| 9,048,594 | B2 * | 6/2015 | Lim | H01R 27/00 |
| 9,077,109 | B1 * | 7/2015 | Lin | G06K 13/0812 |
| 9,083,438 | B2 * | 7/2015 | Tsai | G06K 7/0069 |
| 9,118,140 | B2 * | 8/2015 | Chang | G06K 19/005 |
| 9,124,042 | B2 * | 9/2015 | Matsunaga | H01R 13/74 |
| 9,125,316 | B2 * | 9/2015 | Hsu | H05K 7/1417 |
| 9,236,681 | B2 * | 1/2016 | Yu | H01R 13/5219 |
| 9,647,709 | B1 * | 5/2017 | Li | H04B 1/3816 |
| 9,658,641 | B2 * | 5/2017 | Stephens | H04B 1/38 |
| 9,880,045 | B2 * | 1/2018 | Hanson | G07C 5/08 |
| 9,887,493 | B2 * | 2/2018 | Lee | H01R 13/04 |
| 9,941,632 | B2 * | 4/2018 | Wu | H04B 1/3816 |
| 9,954,328 | B2 * | 4/2018 | Motohashi | H01R 12/721 |
| 2001/0005349 | A1 * | 6/2001 | Maeda | G11B 17/043 720/641 |
| 2002/0177337 | A1 * | 11/2002 | Chun-Lung | G06K 13/08 439/152 |
| 2004/0174687 | A1 * | 9/2004 | Wang | G06F 1/184 361/801 |
| 2004/0190386 | A1 * | 9/2004 | Nakakubo | G06K 19/07741 369/30.03 |
| 2005/0068642 | A1 * | 3/2005 | Harada | G11B 7/0932 359/819 |
| 2005/0124191 | A1 * | 6/2005 | Stanton | H01R 13/5213 439/135 |
| 2005/0253239 | A1 * | 11/2005 | Nishizawa | G06K 7/0021 257/679 |
| 2006/0071073 | A1 * | 4/2006 | Wang | H05K 5/0086 235/441 |

(56) References Cited

U.S. PATENT DOCUMENTS

| Publication No. | Date | Inventor | Classification | Sub |
|---|---|---|---|---|
| 2006/0073848 A1* | 4/2006 | Kwon | H01Q 1/084 | 455/558 |
| 2006/0231619 A1* | 10/2006 | Lee | G06K 13/08 | 235/441 |
| 2006/0274511 A1* | 12/2006 | Choi | G06K 13/08 | 361/754 |
| 2007/0236453 A1* | 10/2007 | Maynard | G06F 17/2211 | 345/158 |
| 2008/0173995 A1* | 7/2008 | Kuratomi | H01L 21/566 | 257/679 |
| 2008/0232060 A1* | 9/2008 | Yu | G06K 19/07732 | 361/731 |
| 2008/0308641 A1* | 12/2008 | Finn | G06K 19/0723 | 235/492 |
| 2009/0023319 A1* | 1/2009 | Hou | H01R 13/2442 | 439/159 |
| 2009/0047835 A1* | 2/2009 | Lin | G06K 13/08 | 439/632 |
| 2009/0267677 A1* | 10/2009 | Myers | G06K 13/08 | 327/356 |
| 2010/0039225 A1* | 2/2010 | Yu | C09D 17/001 | 340/5.83 |
| 2010/0164836 A1* | 7/2010 | Liberatore | G06F 1/1616 | 345/1.1 |
| 2010/0320100 A1* | 12/2010 | Holden | A45F 3/14 | 206/232 |
| 2011/0157820 A1* | 6/2011 | Yang | G06F 1/185 | 361/679.58 |
| 2011/0166824 A1* | 7/2011 | Haisty | G01B 5/12 | 702/157 |
| 2011/0194263 A1* | 8/2011 | Shen | G06K 13/0831 | 361/754 |
| 2011/0255252 A1* | 10/2011 | Sloey | H04B 1/3816 | 361/752 |
| 2012/0162925 A1* | 6/2012 | Luo | G06K 13/0825 | 361/727 |
| 2012/0276780 A1* | 11/2012 | Hu | H01R 12/714 | 439/630 |
| 2012/0307451 A1* | 12/2012 | Shukla | G06F 1/1658 | 361/699 |
| 2012/0309222 A1* | 12/2012 | Takei | H01R 13/6315 | 439/374 |
| 2013/0089998 A1* | 4/2013 | Chen | H04B 1/3816 | 439/331 |
| 2013/0267106 A1* | 10/2013 | Jenks | G11B 17/00 | 439/160 |
| 2013/0286554 A1* | 10/2013 | Heiskanen | G06K 7/0021 | 361/679.01 |
| 2013/0309885 A1* | 11/2013 | Liu | H01R 13/629 | 439/153 |
| 2013/0314854 A1* | 11/2013 | Chung | H05K 5/0239 | 361/679.01 |
| 2013/0334948 A1* | 12/2013 | Chung | H05K 7/1461 | 312/333 |
| 2014/0002971 A1* | 1/2014 | Chung | H05K 5/0286 | 361/679.01 |
| 2014/0029211 A1* | 1/2014 | Gao | H05K 5/0091 | 361/747 |
| 2014/0078660 A1* | 3/2014 | Dondzik | H04B 1/3816 | 361/679.31 |
| 2014/0154926 A1* | 6/2014 | Cao | G06K 7/04 | 439/634 |
| 2014/0315404 A1* | 10/2014 | Wang | G06K 13/08 | 439/159 |
| 2014/0362548 A1* | 12/2014 | Liu | G06F 1/16 | 361/754 |
| 2015/0011118 A1* | 1/2015 | Matsunaga | H01R 13/15 | 439/527 |
| 2015/0022981 A1* | 1/2015 | Tan | G06K 7/0021 | 361/756 |
| 2015/0072549 A1* | 3/2015 | Okoshi | H01R 13/633 | 439/160 |
| 2015/0079847 A1* | 3/2015 | Liu | H01R 12/721 | 439/630 |
| 2015/0155651 A1* | 6/2015 | Ejiri | H01R 13/5213 | 439/521 |
| 2015/0207270 A1* | 7/2015 | Zhang | G06K 13/0831 | 439/159 |
| 2015/0207284 A1* | 7/2015 | Liu | G06K 7/0052 | 439/218 |
| 2017/0187891 A1* | 6/2017 | Ruffing | H04N 1/00103 | |

FOREIGN PATENT DOCUMENTS

| | | |
|---|---|---|
| CN | 203457190 U | 2/2014 |
| CN | 203691461 U | 7/2014 |
| CN | 203825540 U | 9/2014 |
| JP | 3188313 U | 1/2014 |

\* cited by examiner

Figure 11

CARD HOLDER AND ELECTRONIC DEVICE

CROSS REFERENCE TO RELATED APPLICATIONS

This application is the U.S. National Phase Application under 35 U.S.C. § 371 of International Application No. PCT/CN2015/086236, filed Aug. 6, 2015, designating the U.S. and published as WO 2016/176920 A1 on Nov. 10, 2016 which claims the benefit of Chinese Patent Application No. 201510229667.3, filed May 7, 2015, both of which are hereby incorporated by reference in their entirety.

TECHNICAL FIELD

The present application relates to, but not limited to the field of electronic devices.

BACKGROUND

For an electronic device, such as a mobile phone, due to existence of positioning errors of a main board, patch errors of a card base, a manufacturing tolerance of a card holder and the like, an installation position of the card holder has an error, causing that the card try protrudes from a surface of the mobile phone and influencing an appearance of the mobile phone. Therefore, a protruding problem of the card holder must be solved by adjusting the patch position and making a short card holder. However, since sizes of the above errors and tolerance are uncertain, a protruding length of the card holder is uncertain. Therefore, adjusting positions of the patch and lengths of the card holder are different due to different situations, causing poor universality, complex operation and high improvement cost of the above method.

SUMMARY

A subject described in detail in the present disclosure will be summarized below. The summary is not intended to limit a protection range of claims.

The present disclosure provides a card holder and an electronic device, capable of solving a problem that the card holder is protruded from a surface of the electronic device due to positioning errors of a main board, patch errors of a card base and a manufacturing tolerance of the card holder. Moreover, the card holder has good universality and low cost.

A card holder includes: a card holder body, a card holder cap arranged on one side of the card holder body and movably connected with the card holder body, and force application pieces for applying a force to the card holder cap towards the card holder body so that the card holder cap keeps close to the card holder body.

Optionally, the force application piece is an elastic piece arranged between the card holder body and the card holder cap.

Optionally, a clamping groove is arranged on the card holder cap, and a notch is arranged in one slot wall of the clamping groove; and a T-shaped frame is arranged on one side of the card holder body; a horizontal edge of the T-shaped frame is located in the clamping groove; a vertical edge of the T-shaped frame penetrates through the notch; and the elastic piece is located between the horizontal edge of the T-shaped frame (100) and the slot wall of the clamping groove with the notch, and is in a compressed state.

Optionally, a first limiting slot is provided in the horizontal edge of the T-shaped frame (100); one end of the elastic piece is located in the first limiting slot; and/or a second limiting slot is arranged in the slot wall with the notch; and the other end of the elastic piece is located in the second limiting slot.

Optionally, the elastic piece is a spring.

Optionally, the force application piece includes: a permanent magnet arranged on one of the card holder cap and the card holder body, and a soft magnet or permanent magnet arranged on the other one of the card holder cap and the card holder body; or the force application piece includes: a permanent magnet arranged on one of the card holder cap and the card holder body, where the other one of the card holder cap and the card holder body is made of soft magnetic material or permanent magnetic material.

Optionally, a clamping groove is arranged on the card holder cap, and a notch is arranged in one slot wall of the clamping groove; and an inserting head is arranged on one side of the card holder body; and the inserting head extends into the clamping groove after penetrating through the notch.

Optionally, the card holder further includes: a cover plate arranged at an open end of the clamping groove, where the cover plate is fixedly connected with the card holder cap.

Optionally, fixing holes are respectively arranged in the cover plate, the card holder body and the card holder cap which are connected through fixing pieces; and a length of the fixing hole in the card holder body is greater than a diameter of the fixing piece along a movement direction of the card holder cap; and/or a length of the fixing hole in the card holder cap is greater than a diameter of the fixing piece.

Optionally, a clearance exists between an end part of one end of the fixing piece and the cover plate, and a clearance exists between an end part of the other end of the fixing piece and the card holder cap.

Optionally, the fixing piece is a rivet.

Optionally, the cover plate is fixed with the card holder cap by welding.

Optionally, a guide post is arranged on one of the card holder cap and the card holder body; a guide slot is arranged on the other one of the card holder cap and the card holder body; and the guide post extends into the guide slot and is movable relative to the guide slot.

Optionally, the guide post is arranged on the card holder cap; the guide slot is arranged on the card holder body; and the guide post is fixed with the cover plate by welding.

Optionally, there are two force application pieces symmetrically arranged.

Optionally, a limiting surface is arranged on the card holder cap.

An electronic device includes: a device body provided with a card holder slot in which a limiting rib is arranged; and a card holder installed in the card holder slot, including: a card holder body, a card holder cap arranged on one side of the card holder body, and force application pieces for applying a force to the card holder cap towards the card holder body, where the card holder cap is movably connected with the card holder body; and the force application pieces enable the card holder cap to keep close to the card holder body; and a limiting surface is arranged on the card holder cap; the limiting surface is abutted against the limiting rib so that an outer wall surface of a side wall of the card holder cap is flush with a surface of the device body; and a shape of the outer wall surface of the side wall of the card holder cap is adapted with a shape of an opening of the card holder slot.

Compared with a relevant technology, in the card holder of embodiments of the present disclosure, the card holder cap can keep inward contraction relative to the card holder body under an action of the force application pieces, thereby shortening the length of the card holder and solving a problem that the card holder is protruded from a surface of the electronic device due to positioning errors of a main board, patch errors of a card base and a manufacturing tolerance of the card holder in the relevant technology. Moreover, the card holder has adjustable length, good universality and low cost.

In the electronic device provided with the card holder of embodiments of the present disclosure, since the limiting surface of the card holder cap is always close to the limiting rib in the card holder slot, the card holder cap keeps flush with the surface of the electronic device, thereby avoiding problems of poor aesthetic property of an appearance of the electronic device, inconvenient card insertion and the like caused by sinking of the card holder.

Other aspects can be understood after drawings and detailed description are read and comprehended.

In the figures, corresponding relationships between reference numerals and component names in FIG. 1 to FIG. 11 are as follows:

1: Card holder; 10: Card holder body; 100: T-shaped frame; 1000: First limiting slot; 101: Inserting head; 102: Fixing hole; 103: Guide slot; 11: Card holder cap; 110: Clamping groove; 1100: Notch; 111: Fixing hole; 112: Guide post; 113: Limiting surface; 114: Installation slot; 12: Spring; 13: Magnet; 14: Cover plate; 140: Fixing hole; 15: Rivet; 2: Device body; 20: Card holder slot; 21: Limiting rib.

DETAILED DESCRIPTION

Embodiments of the present disclosure will be described below in detail in combination with drawings. It should be noted that embodiments in the present application and features in embodiments can be combined mutually without conflict.

Figure 1:
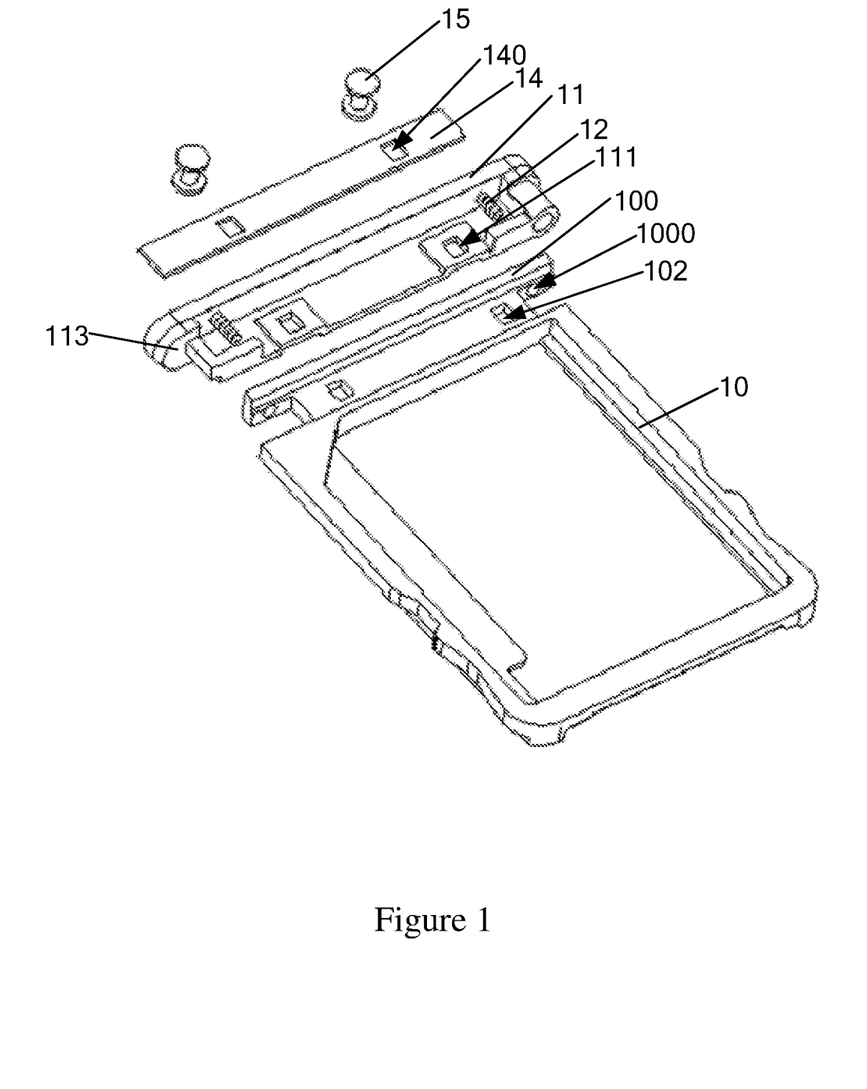
FIG. 1 is a schematic diagram illustrating a breakdown structure of a card holder in a first embodiment of the present disclosure.
Figure 2:
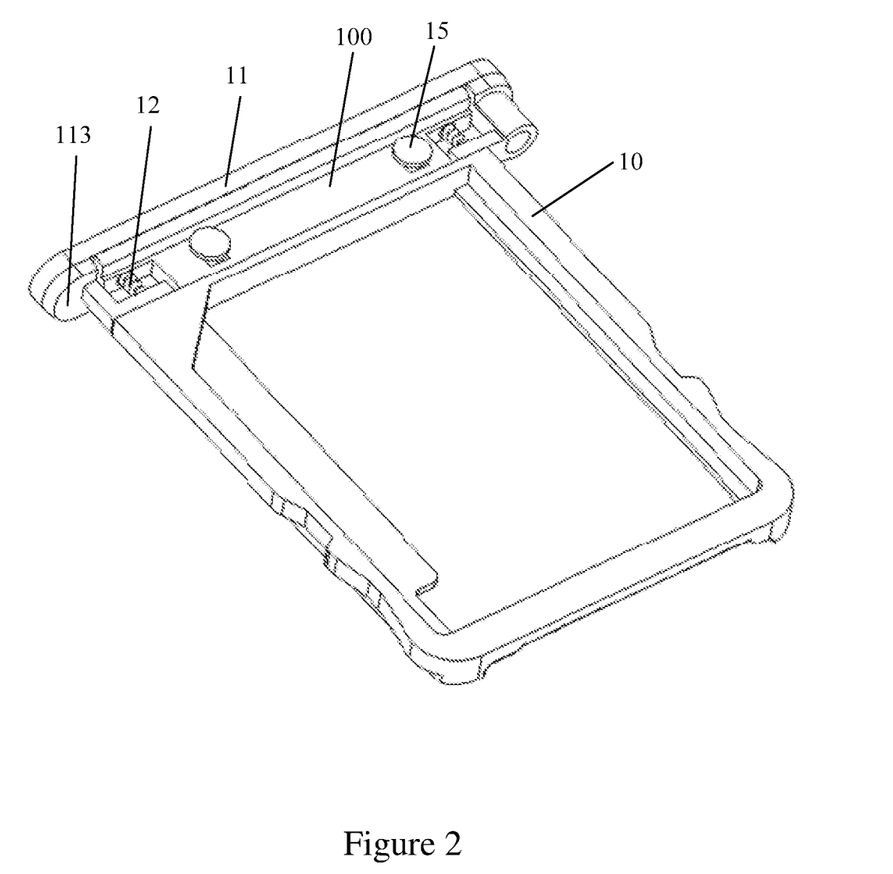
FIG. 2 is a schematic diagram illustrating an assembly structure after a cover plate is omitted from the card holder as shown in FIG. 1.
Figure 3:
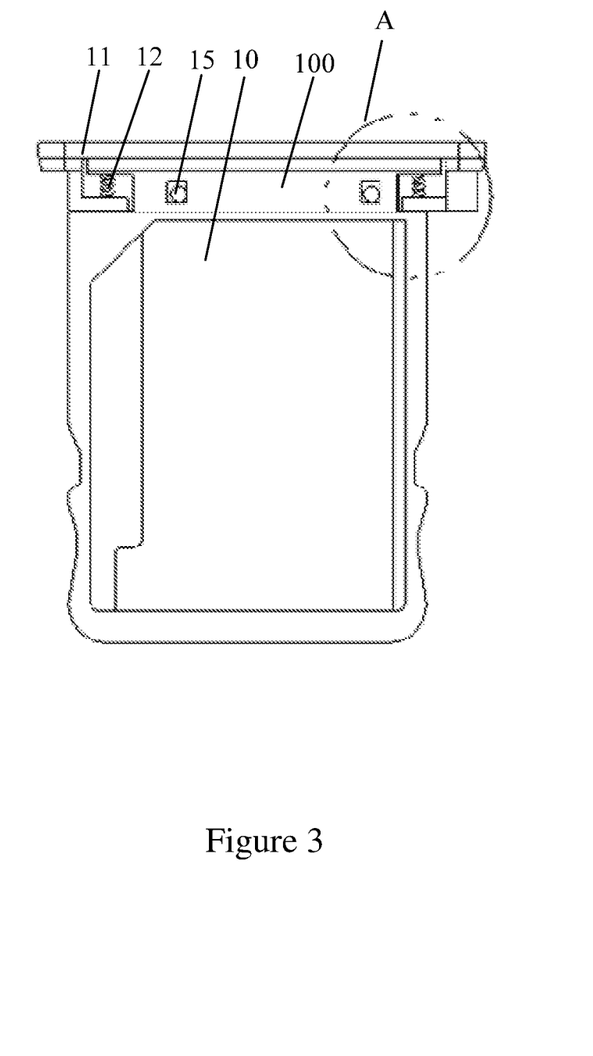
FIG. 3 is a schematic diagram illustrating a main view structure of FIG. 2.
Figure 4:
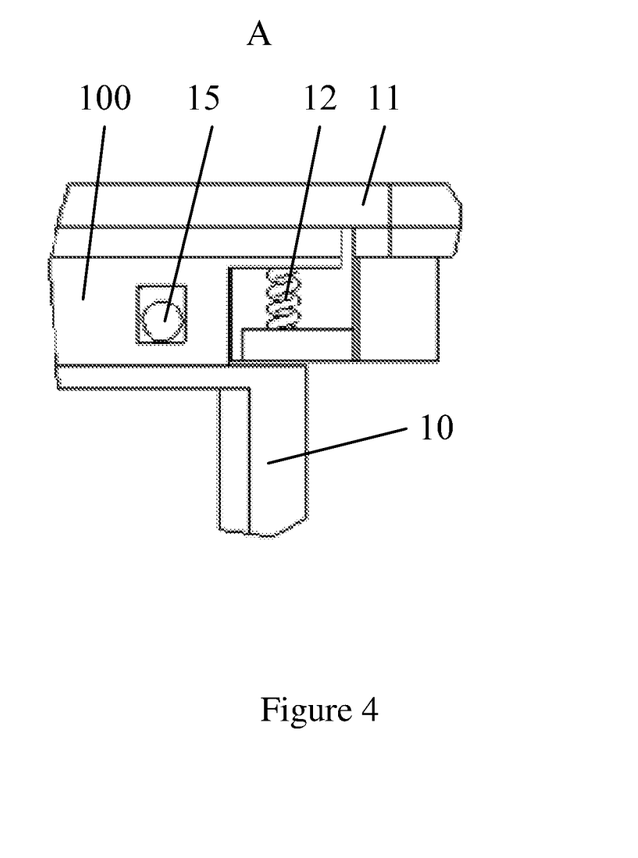
FIG. 4 is an schematic amplified diagram illustrating an A part structure of FIG. 3.
Figure 5:
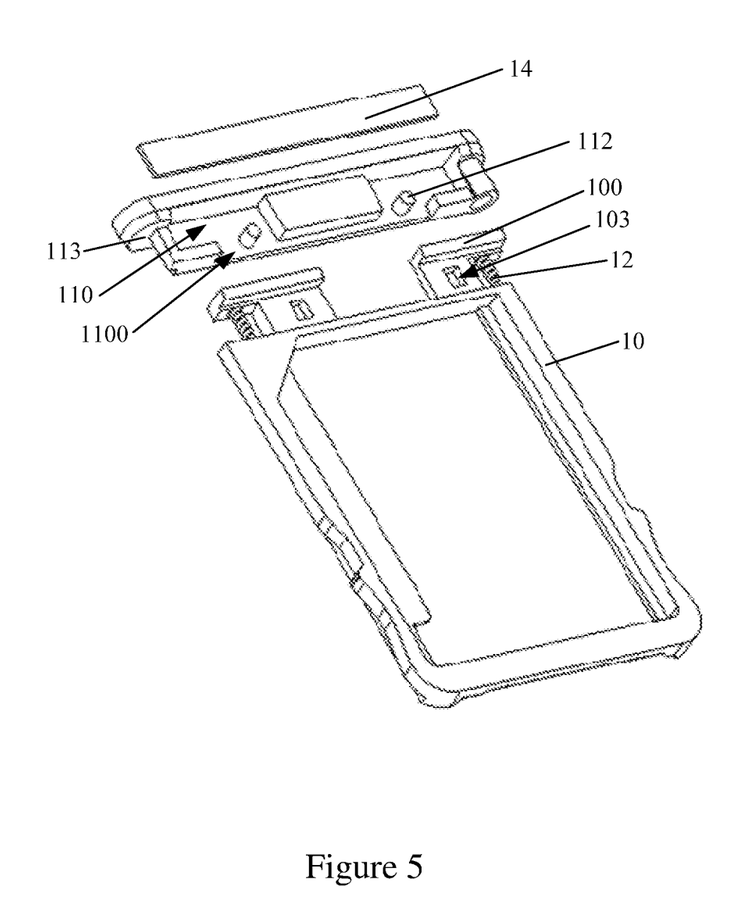
FIG. 5 is a schematic diagram illustrating a breakdown structure of a card holder in a second embodiment of the present disclosure.
Figure 8:
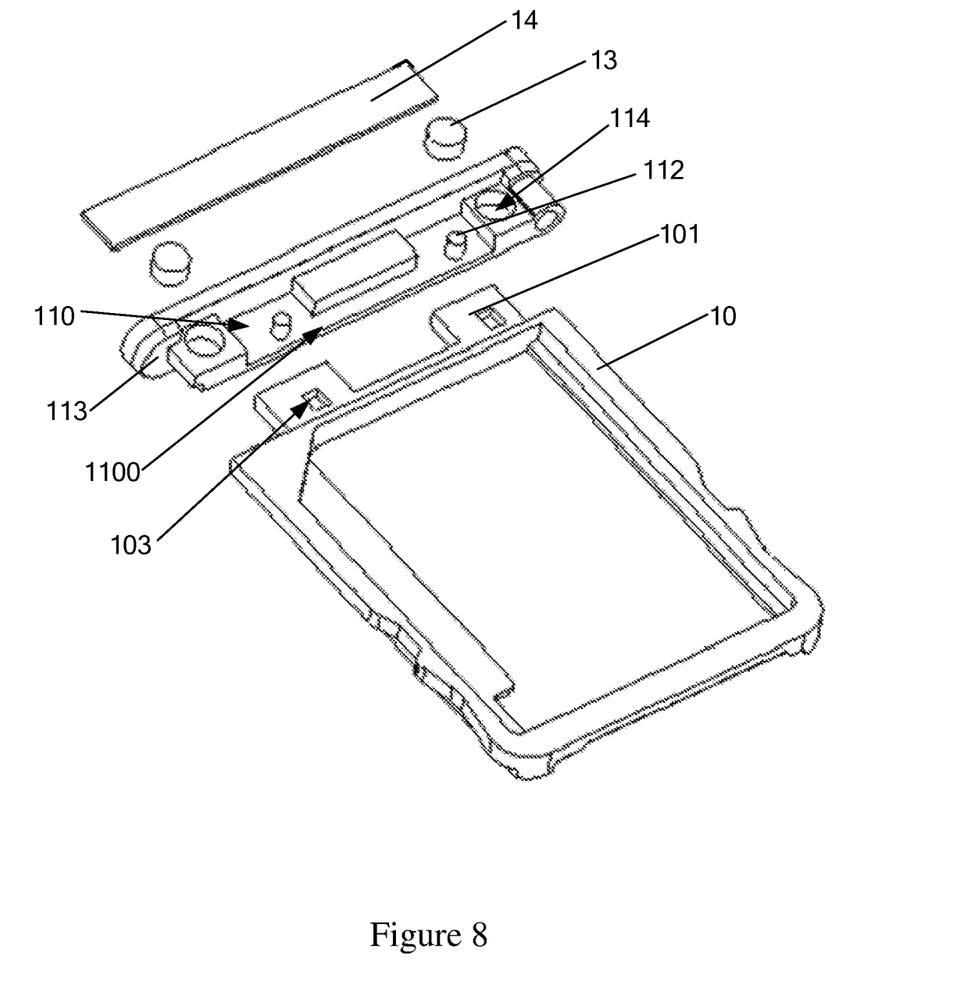
FIG. 8 is a schematic diagram illustrating a breakdown structure of a card holder in a third embodiment of the present disclosure.

A first embodiment of the present disclosure provides a card holder 1. As shown in FIG. 1, FIG. 5 and FIG. 8, the card holder 1 includes: a card holder body 10, a card holder cap 11 arranged on one side of the card holder body 10 and movably connected with the card holder body 10, and force application pieces for applying a force to the card holder cap 11 towards the card holder body 10 so that the card holder cap 11 keeps close to the card holder body 10.

In the card holder 1 provided in above embodiments of the present disclosure, through the force applied to the card holder cap 11 towards the card holder body 10 by the force application pieces, the card holder cap 11 keeps inward contraction, thereby shortening the length of the card holder and solving a problem that the card holder 1 is protruded from a surface of the electronic device due to positioning errors of a main board, patch errors of a card base and a manufacturing tolerance of the card holder 1.

In addition, since the card holder cap 11 is movably connected with the card holder body 10, a distance between the card holder cap 11 and the card holder body 10 is adjustable and the length of the card holder 1 is adjustable, thereby extending a use range of the card holder 1 and enabling the card holder 1 to have good universality and low cost.

A limiting surface 113 is further arranged on the card holder cap 11. The limiting surface 113 may be abutted against the limiting rib 21 arranged in the card holder slot 20 on the electronic device, thereby preventing the surface of the card holder 1 from inward sinking in the surface of the electronic device due to sinking of the card holder cap 11. Therefore, the card holder 1 provided in embodiments of the present disclosure realizes adaptive inward contraction of the card holder cap 11 through cooperation between the force application pieces and the limiting surface 113, so that the surface of the card holder cap 11 can be flush with the surface of the electronic device.

In addition, in the card holder 1 provided in above embodiments of the present disclosure:

optionally, as shown in FIG. 1 to FIG. 5, the force application piece is an elastic piece arranged between the card holder body 10 and the card holder cap 11. In the present embodiment, the elastic piece is a spring 12. The card holder cap 11 may be subjected to an elastic force of the spring 12, so that the card holder cap 11 keeps close to the card holder body 10, i.e., in an inward contraction state.

As shown in FIG. 1 to FIG. 4, a clamping groove 110 is arranged on the card holder cap 11; a notch 1100 is formed in one slot wall of the clamping groove 110; a T-shaped frame 100 is arranged on one side of the card holder body 10; a horizontal edge of the T-shaped frame 100 is located in the clamping groove 110; a vertical edge of the T-shaped frame 100 penetrates through the notch 1100; and the spring 12 is located between the horizontal edge and the slot wall of the clamping groove 110 with the notch 1100, and is in a compressed state. The spring 12 in the compressed state can apply a thrust to the slot wall of the clamping groove 110, so that the card holder cap 11 moves towards a side near the card holder body 10 or has a trend of moving near the card holder body 10, thereby reducing the distance between the card holder cap 11 and the card holder body 10, shortening the length of the card holder 1 and avoiding a problem that the card holder 1 is protruded outwards due to an assembly error and a manufacturing error.

A first limiting slot 1000 (as shown in FIG. 1) is formed in the horizontal edge. A second limiting slot (not shown in figures) is formed in the slot wall with the notch 1100. One end of the spring 12 is located in the first limiting slot 1000, and the other end of the spring 12 is located in the second limiting slot to fix both ends of the spring 12, so as to prevent the compressed spring 12 from separating from the horizontal edge of the T-shaped frame 100 and the slot wall of the clamping groove 110.

Optionally, the force application piece includes: a permanent magnet arranged on one of the card holder cap 11 and the card holder body 10, and the other one of the card holder cap 11 and the card holder body 10 is made of soft magnetic material or permanent magnetic material. In embodiments shown in FIG. 8 to FIG. 10, an installation slot 114 is arranged on the card holder cap 11. The magnet 13 (i.e., the permanent magnet) is fixed in the installation slot 114 through an adhesive. The card holder body 10 is made of stainless steel.

As shown in FIG. 8, a clamping groove 110 is arranged on the card holder cap 11; a notch 1100 is formed in one slot wall of the clamping groove 110; an inserting head 101 is arranged on one side of the card holder body 10; and the inserting head 101 extends into the clamping groove 110 after penetrating through the notch 1100.

Figure 9:
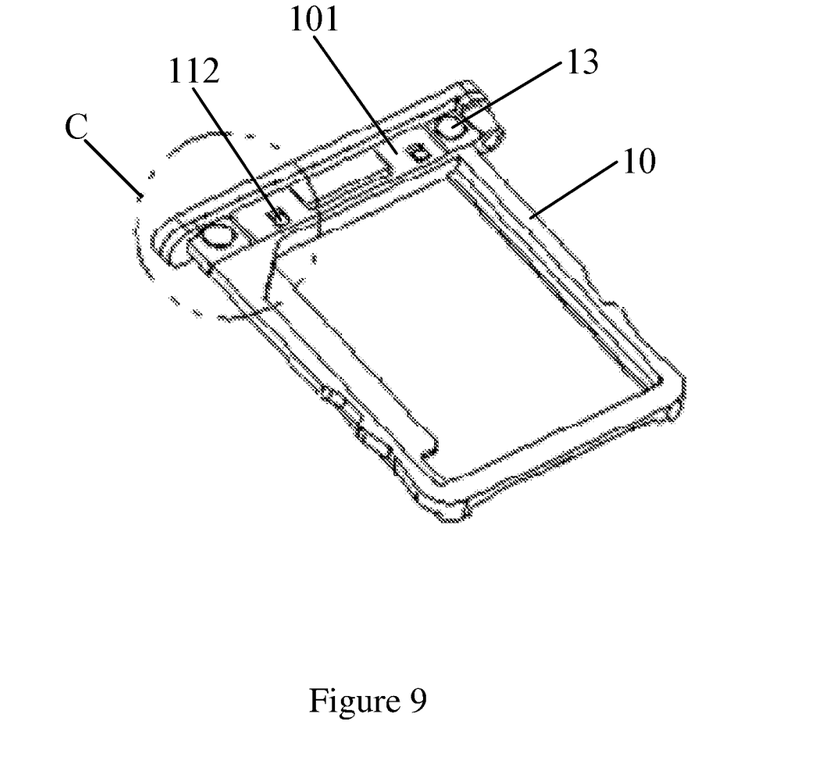
FIG. 9 is a schematic diagram illustrating an assembly structure after a cover plate is omitted from the card holder as shown in FIG. 8.
Figure 10:
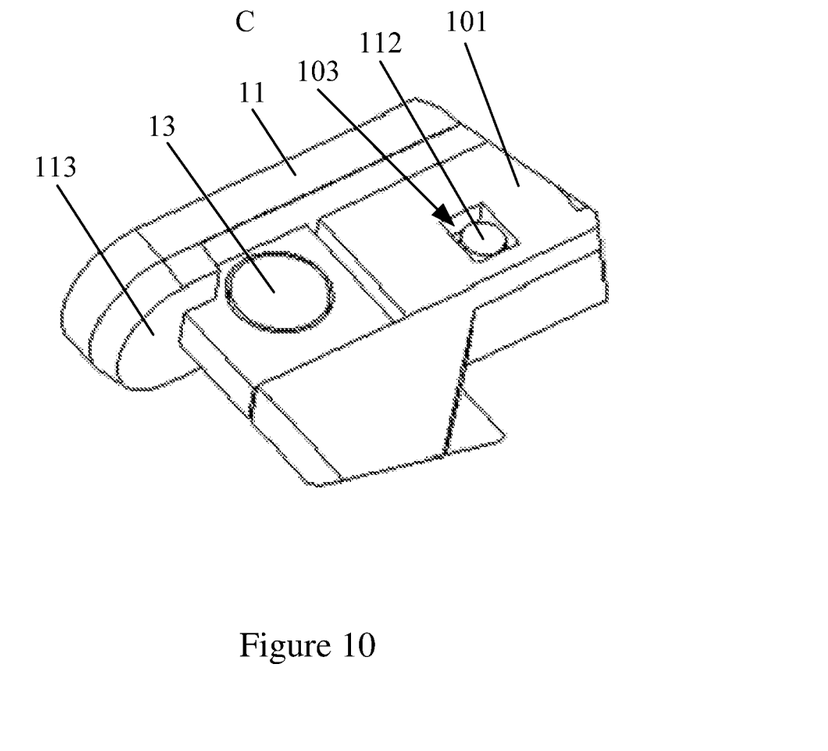
FIG. 10 is an schematic amplified diagram illustrating a C part structure of FIG. 9.

By means of the action of magnetic force between the permanent magnet and the soft magnetic material (or the permanent magnetic material), the card holder cap 11 is subjected to the force towards the card holder body 10 so as to facilitate the card holder cap 11 to keep a retraction state to shorten the length of the card holder 1, thereby solving a problem that the card holder 1 is protruded from a surface of the electronic device due to positioning errors of a main board, patch errors of a card base and a manufacturing tolerance of the card holder 1.

Of course, the other one of the card holder cap 11 and the card holder body 10 may be not made of the soft magnetic material or the permanent magnetic material, but a soft magnet or a permanent magnet is additionally arranged thereon. Similarly, by means of the action of magnetic force between the permanent magnet and the soft magnet (or the permanent magnet), the card holder cap 11 is subjected to the force towards the card holder body 10 so as to facilitate the card holder cap 11 to keep a retraction state.

Optionally, as shown in FIG. 1, FIG. 5 and FIG. 8, the card holder 1 in any of above embodiments further includes: a cover plate 14 arranged at an open end of the clamping groove 110, where the cover plate 14 is fixedly connected with the card holder cap 11. In the present embodiment, the cover plate 14 is fixed with the card holder cap 11 by welding.

Since the cover plate 14 is arranged on the open end of the clamping groove 110, the cover plate 14 can cover the opening of the clamping groove 110, thereby preventing the spring 12 from distorting and falling off in a movement process of the card holder cap 11. Meanwhile, due to the arrangement of the cover plate, the appearance of the card holder is more beautiful.

Optionally, as shown in FIG. 1, fixing holes 140, 102, 111 are respectively formed in the cover plate 14, the card holder body 10 and the card holder cap 11 which are connected through fixing pieces. Optionally, the fixing piece is a rivet 15.

A length of the fixing hole 102 in the card holder body 10 is greater than a diameter of the rivet 15 along a movement direction of the card holder cap 11 (i.e., a force bearing direction of the card holder cap 11); and/or a length of the fixing hole 111 in the card holder cap 11 is greater than a diameter of the rivet 15.

A clearance exists between an end part of one end of the rivet 15 and the cover plate 14, and a clearance exists between an end part of the other end of the rivet 15 and the card holder cap 11.

Since the card holder cap 11 can move relative to the card holder body 10 to keep inward contraction of the card holder cap 11, a length of the fixing hole in at least one of the card holder cap 11 and the card holder body 10 needs to be greater than a diameter of the rivet 15 so as to facilitate the card holder cap 11 to move relative to the card holder body 10. Meanwhile, clearances exist between the end parts of both ends of the rivet 15 and the cover plate 14 and the card holder cap 11, thereby benefiting free movement of the card holder cap 11 relative to the card holder body 10. In addition, the fixing holes are matched with the rivet 15, so as to perform a guidance effect in the movement process of the card holder cap 11, thereby avoiding distortion of the spring 12 and an influence of a retraction effect of the spring 12 on the card holder cap 11.

Figure 6:
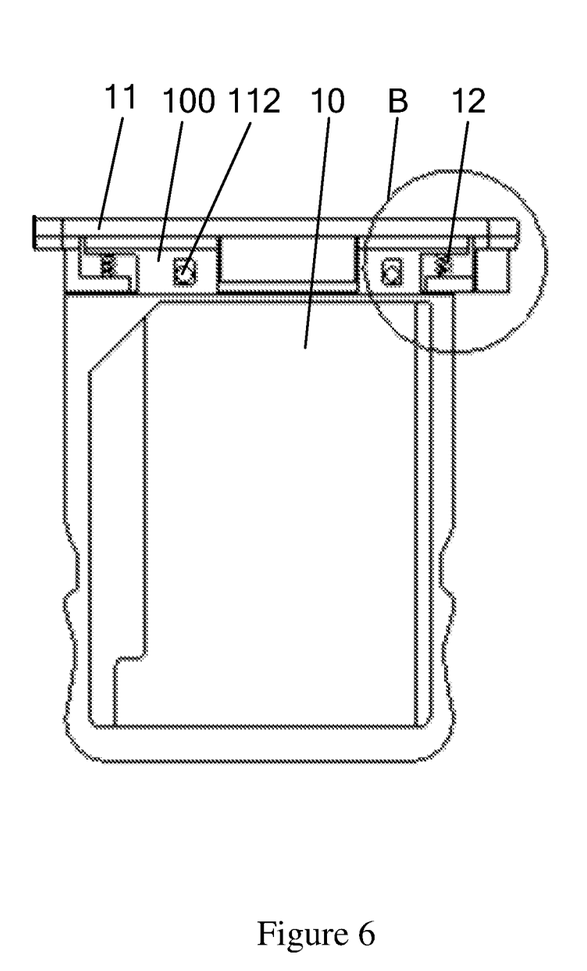
FIG. 6 is a schematic diagram illustrating an assembly structure after a cover plate is omitted from the card holder as shown in FIG. 5.
Figure 7:
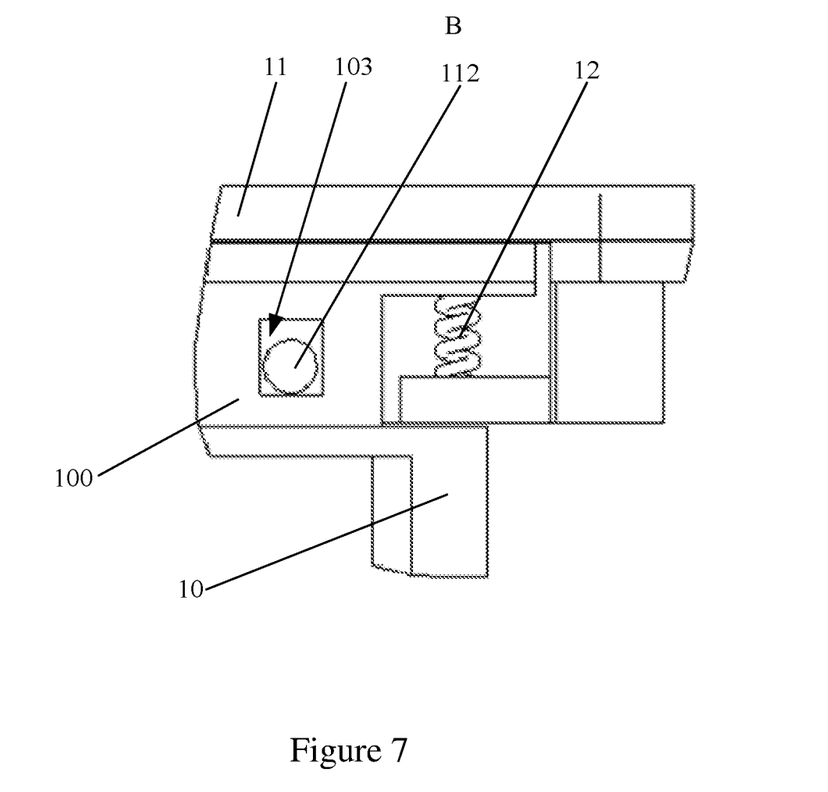
FIG. 7 is an schematic amplified diagram illustrating a B part structure of FIG. 6.

Optionally, as shown in FIG. 5 to FIG. 7, a guide post 112 is arranged on one of the card holder cap 11 and the card holder body 10, and a guide slot 103 is arranged on the other one of the card holder cap 11 and the card holder body 10. The guide post 112 extends into the guide slot 103 and can move relative to the guide slot 103.

The guide post 112 is arranged on the card holder cap 11. The guide slot 103 is arranged on the card holder body 10. The guide post 112 is fixed with the cover plate 14 by welding.

Cooperation between the guide post 112 and the guide slot 103 can perform a guidance effect in the movement process of the card holder cap 11, thereby avoiding distortion of the spring 12 and an influence of a retraction effect of the spring 12 on the card holder cap 11.

In any one of above embodiments, as shown in FIG. 1, FIG. 5 and FIG. 8, optionally, there are two force application pieces symmetrically arranged, so that both sides of the card holder cap 11 bear uniform force, thereby preventing a problem that the card holder cap 11 deflects to one side and cannot smoothly move due to uneven force on both sides of the card holder cap 11.

In embodiments shown in FIG. 1 to FIG. 5, two springs 12 are symmetrically arranged; and in an embodiment shown in FIG. 8, two magnets 13 are symmetrically arranged.

An installation process of the card holder 1 is described below by taking the card holder 1 shown in FIG. 1 to FIG. 4 as follows:

a. the card holder cap 11 and the spring 12 are rotated and installed in the card holder body 10 together, and the cover plate 14 is covered;

b. two rivets 15 penetrate through the fixing holes 140, 102, 111 in the card holder body 10, the card holder cap 11 and the cover plate 14;

c. the rivets 15 are riveted, and the card holder cap 11, the card holder body 10 and the cover plate 14 are connected; and d. the cover plate 14 is arranged on the card holder cap 11 through spot welding.

An installation process of the card holder 1 shown in FIG. 5 to FIG. 7 and an installation process of the card holder 1 shown in FIG. 8 to FIG. 10 are similar to the above installation process and will not be repeated herein.

Figure 11:
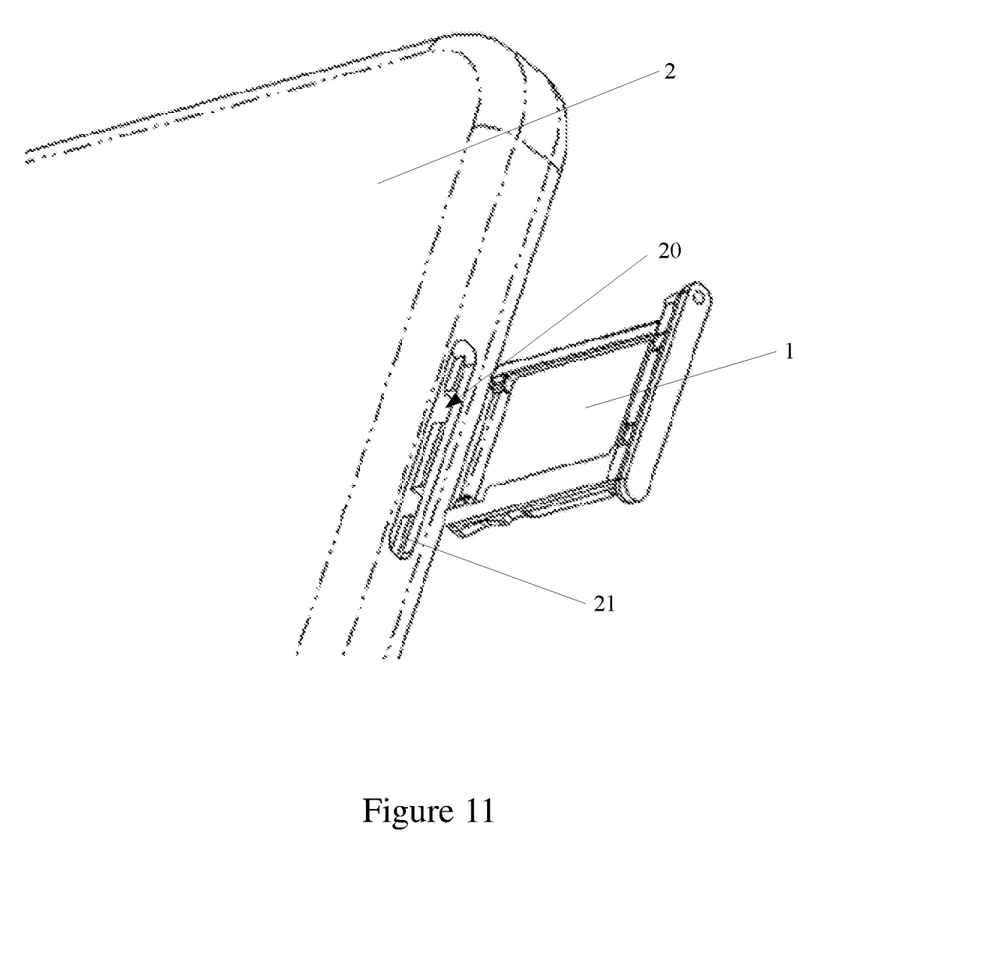
FIG. 11 is a schematic diagram illustrating a breakdown structure of an electronic device in an embodiment of the present disclosure.

Embodiments of the present disclosure further provide an electronic device. As shown in FIG. 11, the electronic device includes: a device body 2 provided with a card holder slot 20 in which a limiting rib 21 is arranged; and the card holder 1 in any of above embodiments, wherein the card holder 1 is installed in the card holder slot 20; the limiting surface 113 of the card holder 1 is abutted against the limiting rib 21 so that an outer wall surface of a side wall of the card holder cap 11 is flush with a surface of the device body 2; and a shape of the outer wall surface of the side wall of the card holder cap 11 is adapted with a shape of an opening of the card holder slot 20.

Optionally, the electronic device is a mobile phone, a computer and the like.

The electronic device described in above embodiments of the present disclosure includes the card holder described in any of above embodiments and has all beneficial effects of the card holder in any of above embodiments, and is not repeated herein.

In conclusion, compared with a relevant technology, the card holder of embodiments of the present disclosure is a split-type card holder which includes the card holder body and the card holder cap capable of moving relative to the card holder body. The card holder cap can keep inward contraction relative to the card holder body under an action of the force application pieces, and the limiting surface of the card holder cap is always close to the limiting rib in the card holder slot, so that the card holder cap keeps flush with the surface of the electronic device, thereby solving a problem that the card holder is protruded from a surface of the electronic device due to positioning errors of a main board, patch errors of a card base and a manufacturing tolerance of the card holder in the relevant technology.

In description of the present specification, terms of "connection", "fixation" and "installation" shall be understood in broad sense. For example, "connection" may refer to fixed connection, detachable connection or integral connection, and may refer to direct connection, and indirect connection through an intermediate medium. For those ordinary skilled in the art, specific meanings of above terms in the present disclosure can be understood according to actual conditions.

INDUSTRIAL APPLICABILITY

The card holder cap of the card holder in embodiments of the present disclosure can keep inward contraction relative to the card holder body under the action of the force application pieces, thereby shortening the length of the card holder and solving a problem that the card holder is protruded from a surface of the electronic device due to positioning errors of a main board, patch errors of a card base and a manufacturing tolerance of the card holder in the relevant technology. Moreover, the card holder has adjustable length, good universality and low cost. In the electronic device provided with the card holder of embodiments of the present disclosure, since the limiting surface of the card holder cap is always close to the limiting rib in the card holder slot, the card holder cap keeps flush with the surface of the electronic device, thereby avoiding problems of poor aesthetic property of an appearance of the electronic device, inconvenient card insertion and the like caused by sinking of the card holder.

What is claimed is:

1. A card holder, comprising:
    a card holder body;
    a card holder cap disposed on one side of the card holder body; and movably connected with the card holder body; and
    elastic pieces configured to apply a force to the card holder cap towards the card holder body such that the card holder cap remains close to the card holder body;
    a clamping groove disposed on the card holder cap, and a notch disposed on one slot wall of the clamping groove; and
    a T-shaped frame disposed on one side of the card holder body; wherein a first edge of the T-shaped frame is disposed in the clamping groove, and a second edge of the T-shaped frame is configured to penetrate through the notch, and the first edge is perpendicular to the second edge;
    wherein a first end of each of the elastic pieces is abutted against the first edge of the T-shaped frame, a second end of each of the elastic pieces is abutted against the slot wall of the clamping groove with the notch, and each of the elastic pieces is in a compressed state.

2. The card holder according to claim 1, further comprising:
    a first limiting slot disposed in the first edge of the T-shaped frame, and one end of each of the elastic pieces is disposed in the first limiting slot;
    and/or a second limiting slot disposed in the slot wall with the notch; and an other end of each of the elastic pieces is disposed in the second limiting slot.

3. The card holder according to claim 1, wherein the elastic pieces comprise a spring.

4. The card holder according to claim 1, further comprising: a cover plate disposed at an open end of the clamping groove, wherein the cover plate is fixedly connected with the card holder cap.

5. The card holder according to claim 4, wherein fixing holes are respectively disposed in the cover plate, the card holder body and the card holder cap which are connected through fixing pieces; and
    a length of the fixing holes in the card holder body is greater than a diameter of the fixing pieces along a movement direction of the card holder cap; and/or a length of the fixing holes in the card holder cap is greater than a diameter of the fixing pieces.

6. The card holder according to claim 5, further comprising:
    a clearance between an end part of one end of the fixing pieces and the cover plate, and
    a clearance between an end part of an other end of the fixing pieces and the card holder cap.

7. The card holder according to claim 4, wherein:
    a guide post is disposed on one of the card holder cap and the card holder body;
    a guide slot is disposed on the other one of the card holder cap; and the card holder body, and wherein the guide post extends into the guide slot and is movable relative to the guide slot.

8. The card holder according to claim 7, wherein:
    the guide post is disposed on the card holder cap;
    the guide slot is disposed on the card holder body; and
    the guide post is fixed with the cover plate by welding.

9. The card holder according to claim 1, wherein the force application pieces comprise two force application pieces symmetrically disposed.

10. The card holder according to claim 1, wherein a limiting surface is disposed on the card holder cap.

11. An electronic device, comprising:
a device body provided with a card holder slot in which a limiting rib is disposed; and
a card holder disposed in the card holder slot, comprising:
a card holder body, a card holder cap disposed on one side of the card holder body, and force application pieces configured to apply a force to the card holder cap towards the card holder body, wherein the card holder cap is movably connected with the card holder body; and the force application pieces enable the card holder cap to remain close to the card holder body;
a clamping groove disposed on the card holder cap, and a notch disposed on one slot wall of the clamping groove; and
a T-shaped frame disposed on one side of the card holder body; wherein a first edge of the T-shaped frame is disposed in the clamping groove, and a second edge of the T-shaped frame is configured to penetrate through the notch, and the first edge is perpendicular to the second edge;
wherein a first end of each of the elastic pieces is abutted against the first edge of the T-shaped frame, a second end of each of the elastic pieces is abutted against the slot wall of the clamping groove with the notch, and each of the elastic pieces is in a compressed state; and
wherein a limiting surface is disposed on the card holder cap; the limiting surface is abutted against the limiting rib such that an outer wall surface of a side wall of the card holder cap is flush with a surface of the device body; and a shape of the outer wall surface of the side wall of the card holder cap is adapted with a shape of an opening of the card holder slot.

12. A card holder, comprising:
a card holder body;
a card holder cap disposed on one side of the card holder body; and movably connected with the card holder body; and
force application pieces configured to apply a force to the card holder cap towards the card holder body such that the card holder cap remains close to the card holder body;
a clamping groove disposed on the card holder cap, and a notch disposed in one slot wall of the clamping groove;
an inserting head disposed on one side of the card holder body, the inserting head is configured to extend into the clamping groove after penetrating through the notch; and
wherein a guide post is disposed on one of the card holder cap and the card holder body, a guide slot is disposed on the other one of the card holder cap and the card holder body, and the guide post extends into the guide slot and is movable relative to the guide slot.

13. The card holder according to claim 12, wherein the force application pieces comprises:
a permanent magnet disposed on one of the card holder cap or the card holder body, and a soft magnet or permanent magnet disposed on the other one of the card holder cap or the card holder body; or
a permanent magnet disposed on one of the card holder cap, and the card holder body, wherein the other one of the card holder cap and the card holder body comprises soft magnetic material or permanent magnetic material.

14. The card holder according to claim 13, further comprising: a cover plate disposed at an open end of the clamping groove, wherein the cover plate is fixedly connected with the card holder cap.

15. The card holder according to claim 14, wherein:
the guide post is disposed on the card holder cap;
the guide slot is disposed on the card holder body; and
the guide post is fixed with the cover plate by welding.

16. The card holder according to claim 12, wherein the force application pieces comprise two force application pieces symmetrically disposed.

17. The card holder according to claim 12, wherein a limiting surface is disposed on the card holder cap.

* * * * *